(12) United States Patent
Lin et al.

(10) Patent No.: US 11,955,542 B2
(45) Date of Patent: Apr. 9, 2024

(54) SEMICONDUCTOR DEVICE

(71) Applicant: Vanguard International Semiconductor Corporation, Hsinchu (TW)

(72) Inventors: Hsin-Chih Lin, Hsinchu (TW); Shin-Cheng Lin, Tainan (TW); Yung-Hao Lin, Jhunan Township (TW)

(73) Assignee: VANGUARD INTERNATIONAL SEMICONDUCTOR CORPORATION, Hsinchu (TW)

( * ) Notice: Subject to any disclaimer, the term of this patent is extended or adjusted under 35 U.S.C. 154(b) by 258 days.

(21) Appl. No.: 17/202,612

(22) Filed: Mar. 16, 2021

(65) Prior Publication Data
US 2021/0226048 A1 Jul. 22, 2021

Related U.S. Application Data

(62) Division of application No. 15/852,203, filed on Dec. 22, 2017, now Pat. No. 10,998,434.

(51) Int. Cl.
| | | |
|---|---|---|
| *H01L 29/778* | (2006.01) | |
| *H01L 29/10* | (2006.01) | |
| *H01L 29/20* | (2006.01) | |
| *H01L 29/205* | (2006.01) | |
| *H01L 29/423* | (2006.01) | |
| *H01L 29/66* | (2006.01) | |

(52) U.S. Cl.
CPC ...... *H01L 29/7787* (2013.01); *H01L 29/1054* (2013.01); *H01L 29/2003* (2013.01); *H01L 29/42364* (2013.01); *H01L 29/66462* (2013.01); *H01L 29/7786* (2013.01); *H01L 29/205* (2013.01)

(58) Field of Classification Search
CPC ............... H01L 29/778; H01L 29/7787; H01L 29/7786; H01L 29/2003; H01L 29/66462; H01L 29/1054; H01L 29/42364
See application file for complete search history.

(56) References Cited

U.S. PATENT DOCUMENTS

| | | | |
|---|---|---|---|
| 2009/0072272 A1 | 3/2009 | Suh et al. | |
| 2010/0314696 A1 | 12/2010 | Nishio et al. | |
| 2011/0062437 A1* | 3/2011 | Chang | ............... H01L 21/02538 257/E29.094 |
| 2013/0092947 A1* | 4/2013 | Green | ................. H01L 29/7787 257/E21.409 |

(Continued)

FOREIGN PATENT DOCUMENTS

| | | |
|---|---|---|
| CN | 101882656 B | 3/2014 |
| CN | 104009074 B | 7/2017 |

*Primary Examiner* — Aaron J Gray
(74) *Attorney, Agent, or Firm* — Birch, Stewart, Kolasch & Birch, LLP

(57) ABSTRACT

A semiconductor device is provided. The semiconductor device includes a substrate, a first III-V compound layer disposed on the substrate, a second III-V compound layer disposed on the first III-V compound layer, a p-type doped III-V compound layer disposed on the second III-V compound layer, a gate disposed over the p-type doped III-V compound layer, a source and a drain disposed on opposite sides of the gate, and a dielectric layer disposed between the p-type doped III-V compound layer and the gate. A method for forming the above semiconductor device is also provided.

11 Claims, 2 Drawing Sheets

(56) References Cited

U.S. PATENT DOCUMENTS

| | | |
|---|---|---|
| 2014/0252371 A1 | 9/2014 | Kwak et al. |
| 2015/0021671 A1 | 1/2015 | Nagahisa et al. |
| 2016/0141404 A1* | 5/2016 | Tsai ................. H01L 29/66462 |
| | | 438/172 |
| 2017/0062581 A1 | 3/2017 | You et al. |
| 2017/0077280 A1 | 3/2017 | Furukawa |
| 2017/0288046 A1 | 10/2017 | Miyamoto et al. |
| 2018/0219089 A1 | 8/2018 | Nakayama et al. |
| 2020/0212211 A1* | 7/2020 | Radosavljevic .... H01L 29/7786 |

* cited by examiner

SEMICONDUCTOR DEVICE

CROSS REFERENCE TO RELATED APPLICATIONS

This application is a Divisional of U.S. patent application Ser. No. 15/852,203, filed Dec. 22, 2017 and entitled "SEMICONDUCTOR DEVICE AND METHOD FOR FORMING THE SAME".

BACKGROUND OF THE INVENTION

Field of the Invention

The present invention relates to a semiconductor device, and in particular it relates to a semiconductor device which is able to suppress the gate leakage current and a method for forming the same.

Description of the Related Art

In the semiconductor industry, gallium nitride (GaN) is usually used to form various integrated circuit components, such as high electron mobility transistor (HEMT) elements. In the HEMT elements, the enhancement mode high electron mobility transistors (E-mode HEMT) elements are widely used in the industry.

The methods for forming the E-mode HEMT elements can be generally divided into two types. One of the methods is to change the thickness of the aluminum gallium nitride (AlGaN) layer using a gate recess process, thereby reducing the density of the two-dimensional electron gas (2-DEG). However, because the thickness of the aluminum gallium nitride (AlGaN) layer becomes thinner during the gate recess process, a high resistance channel will be produced and the overall performance of the elements will be reduced.

Another method is to make the threshold voltage be greater than zero by disposing a p-type gallium nitride layer on the AlGaN layer to change the band gap of the underlying layer. Since no gate recess process is used during this method, there is no high-resistance channel produced. In contrast, low resistance channels can be kept in the elements. However, in such a device structure, the gate metal is directly formed on the p-type gallium nitride layer. The direct contact of the gate metal and the p-type gallium nitride layer forms a Schottky contact. When a forward voltage is applied to start the element, a huge gate leakage current will be generated. Such leakage currents have a negative effect on the performance of the elements.

Thus, in this technical field, an E-mode HEMT element which is able to suppress the gate leakage current and a method for forming the same are desirable.

BRIEF SUMMARY OF THE INVENTION

In one embodiment of the present disclosure, a semiconductor device is provided. The semiconductor device includes a substrate, a first III-V compound layer disposed on the substrate, a second III-V compound layer disposed on the first III-V compound layer, a p-type doped III-V compound layer disposed on the second III-V compound layer, a gate disposed over the p-type doped III-V compound layer, a source and a drain disposed on opposite sides of the gate, and a dielectric layer disposed between the p-type doped III-V compound layer and the gate.

In another embodiment of the present disclosure, a method for forming a semiconductor device is provided. In an exemplary embodiment of the method for forming a semiconductor device, a substrate is provided. A first III-V compound layer is formed on the substrate. A second III-V compound layer is formed on the first III-V compound layer. A p-type doped III-V compound layer is formed on the second III-V compound layer. A dielectric layer is formed over the p-type doped III-V compound layer. A gate is formed on the dielectric layer. A source and a drain are formed on opposite sides of the gate.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

Figure 1:
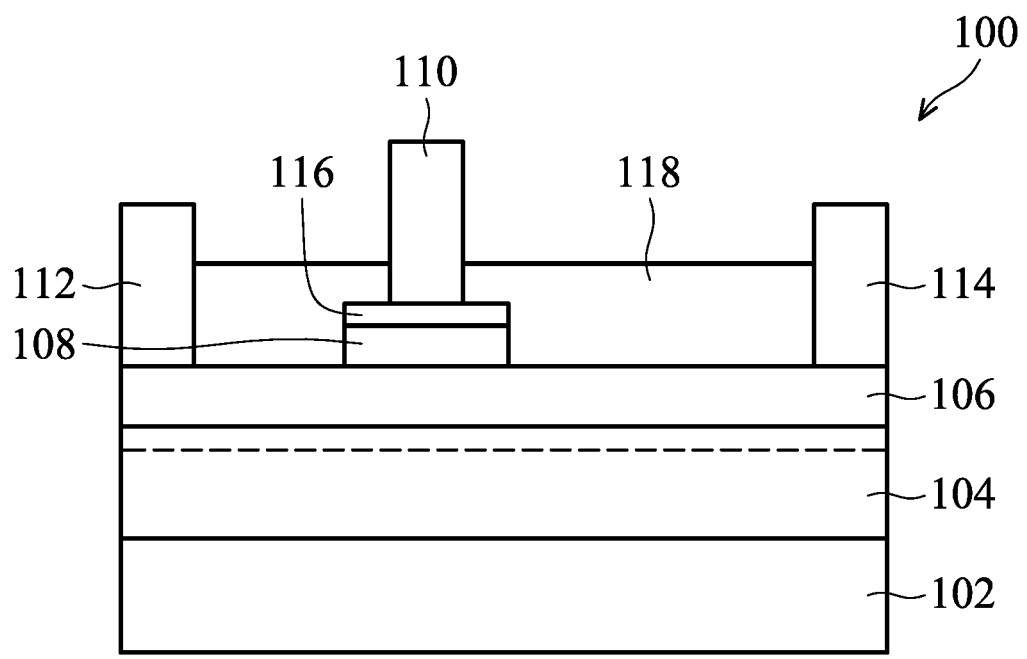
FIG. 1 is a cross-sectional view of a semiconductor device in accordance with one embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. It is noted that, in accordance with the standard practice in the industry, various features are not drawn to scale. In fact, the dimensions of the various features may be arbitrarily increased or reduced for clarity of discussion.

As used herein, the singular forms "a," "an" and "the" are intended to include the plural forms as well, unless the context clearly indicates otherwise. It will be further understood that the terms "comprises" and/or "comprising,"—when used in this specification, specify the presence of stated features, integers, steps, operations, elements, and/or components, but do not preclude the presence or addition of one or more other features, integers, steps, operations, elements, components, and/or groups thereof.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Embodiments of the present disclosure provide a semiconductor device. In some embodiments of the present disclosure, the semiconductor is an enhancement mode high electron mobility transistor (E-mode HEMT) element. By at least disposing a dielectric layer between the gate metal and the p-type gallium nitride layer to isolate the gate metal from the p-type gallium nitride layer in the E-mode HEMT element, an isolation effect of suppressing the gate leakage current is provided. In addition, since the formation of the dielectric layer does not affect the band gap change provided by the p-type gallium nitride layer, in the semiconductor device provided by the present disclosure, the gate leakage current is reduced, the gate operating voltage is enhanced, and the aforementioned low resistance channels can be kept. Therefore, the overall performance of the elements is improved.

In addition, compared to the currently used p-type gallium nitride layer, the p-type gallium nitride layer used in the present disclosure further includes additional dopants. Hereinafter, the p-type gallium nitride layer used in the present disclosure is called "p-type doped gallium nitride layer". The "p-type doped gallium nitride layer" described in the present disclosure is doped with at least one of magnesium (Mg), calcium (Ca), zinc (Zn), beryllium (Be), and carbon (C) and is further added with other dopants selected from a group consisting of strontium (Sr), barium (Ba), and radium (Ra), for example. It should be noted that as long as the additional dopants can change the band gap of the underlying layer (such as gallium nitride layer and aluminum gallium nitride layer), the dopant can be used in the present disclosure and is not limited to those described above.

In some embodiments of the present disclosure, "p-type doped III-V compound layer" is also used to describe the "p-type doped gallium nitride layer". It should be realized that the "p-type doped III-V compound layer" described in the present disclosure may further include layers composed of other III-V compounds in the periodic table and is not limited to the gallium nitride layer.

Figure 2:
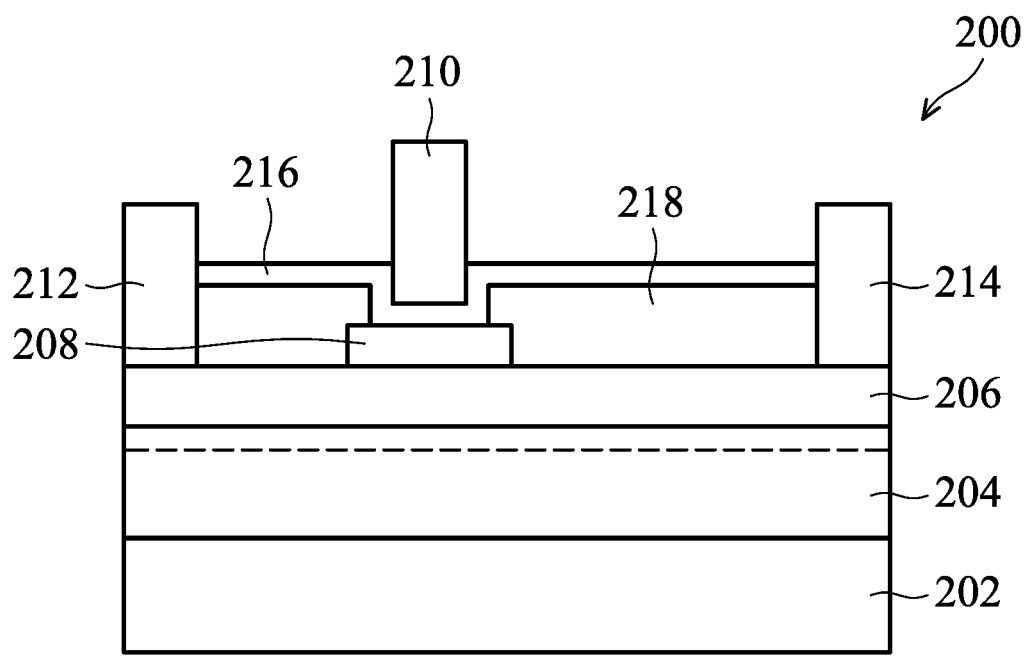
FIG. 2 is a cross-sectional of a semiconductor device in accordance with another embodiment of the present disclosure.
Figure 3:
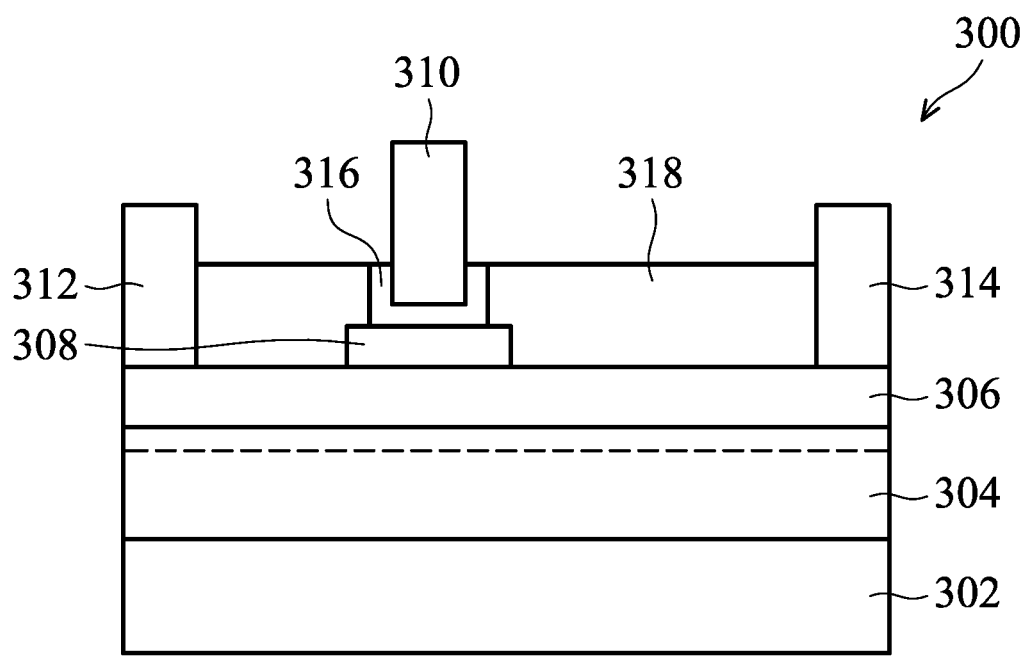
FIG. 3 is a cross-sectional of a semiconductor device in accordance with another embodiment of the present disclosure.

FIG. 1, FIG. 2 and FIG. 3 respectively represents the cross-sectional views of the semiconductor devices 100, 200 and 300 in accordance with some embodiments of the present disclosure. Referring to FIGS. 1-3, the semiconductor devices 100, 200 and 300 and the methods for forming the same are described as follows.

As shown in FIG. 1, the semiconductor device 100 in accordance with some embodiments of the present disclosure includes a substrate 102, a first III-V compound layer 104 disposed on the substrate 102, a second III-V compound layer 106 disposed on the first III-V compound layer 104, a p-type doped III-V compound layer 108 disposed on the second III-V compound layer 106, a gate 110 disposed over the p-type doped III-V compound layer 108, a source 112 and a drain 114 disposed on opposite sides of the gate 110, and a dielectric layer 116 disposed between the p-type doped III-V compound layer 108 and the gate 110. Each of the above components will be discussed in more detail in the following paragraphs.

As shown in FIG. 1, the semiconductor device 100 in accordance with some embodiments of the present disclosure includes a substrate 102. In some embodiments, the substrate 102 may include a sapphire substrate, a silicon substrate, or a silicon carbide substrate. In some embodiments, the substrate 102 may include a semiconductor material, an insulator material, a conductor material, or one or more layers composed of a combination thereof. For example, the substrate 102 may be selected from at least one semiconductor material selected from a group consisting of Si, Ge, SiGe, GaP, GaAs, SiC, SiGeC, InAs, and InP. In another embodiment, the substrate 102 may also include a silicon on insulator (SOI). In another embodiment, the substrate 102 may also be composed of a multi-layered material, for example, Si/SiGe and Si/SiC. In another embodiment, the substrate 102 may include an insulator material, for example, an organic insulator, an inorganic insulator, or one or more layers composed of a combination thereof. In another embodiment, the substrate 102 may also include a conductive material, for example, polysilicon, metal, alloy, or one or more layers composed of a combination thereof.

In some embodiments, the semiconductor device 100 in accordance with some embodiments of the present disclosure may further include a buffer layer disposed above the substrate 102. The function of the buffer layer is to reduce the strain generated by the substrate 102 and the III-V compound layer formed thereafter. The buffer layer may be an aluminum nitride (AlN) layer, for example. The lattice differences and the coefficient of thermal expansion of the AlN crystal nucleus layer and the substrate 102 are small, and thus the strain generated between the substrate 102 and the III-V compound layer formed thereafter is reduced.

As shown in FIG. 1, the semiconductor device 100 includes a first III-V compound layer 104 formed on the substrate 102, and a second III-V compound layer 106 formed on the first III-V compound layer 104. The first III-V compound layer 104 and the second III-V compound layer 106 are composed of compounds made from the III-V elements in the periodic table. However, the first III-V compound layer 104 and the second III-V compound layer 106 are different from each other in composition. The first III-V compound layer 104 and the second III-V compound layer 106 directly contact each other. In one embodiment, the first III-V compound layer 104 includes a gallium nitride (GaN) layer (also referred to as the gallium nitride layer 104 hereinafter). In one embodiment, the second III-V compound layer 106 includes an aluminum gallium nitride ($Al_xGa_{1-x}N$) layer (also referred to as the aluminum gallium nitride 106 hereinafter), wherein $0<x<1$.

The gallium nitride layer 104 may be epitaxially grown by metal organic vapor phase epitaxy (MOVPE) using gallium-containing precursor and nitrogen-containing precursor. The gallium-containing precursor includes trimethylgallium (TMG), triethylgallium (TEG), or other suitable chemical. The nitrogen-containing precursor includes ammonia ($NH_3$), tertiarybutylamine (TBAm), phenyl hydrazine, or other suitable chemical. In one embodiment, the gallium nitride layer 104 may have a thickness ranging between about 0.2 μm and about 10 μm.

The aluminum gallium nitride 106 may be epitaxially grown by MOVPE using aluminum-containing precursor, gallium-containing precursor, and nitrogen-containing precursor. The aluminum-containing precursor includes trimethylaluminum (TMA), triethylaluminum (TEA), or other suitable chemicals. The gallium-containing precursor includes trimethylgallium (TMG), triethylgallium (TEG), or other suitable chemicals. The nitrogen-containing precursor includes ammonia ($NH_3$), tert-butylamine (TBAm), phenyl hydrazine, or other suitable chemicals. In one embodiment, the aluminum gallium nitride layer 106 may have a thickness ranging between about 1 nm and about 100 nm. The composition ratio of aluminum and the thickness of the aluminum nitride gallium layer 106 can be adjusted according to the actual requirement to substantially control the critical voltage of the element.

As shown in FIG. 1, the semiconductor device 100 includes a p-type doped III-V compound layer 108 formed on the aluminum nitride gallium layer 106. The p-type doped III-V compound layer 108 includes a p-type doped nitride gallium layer (also referred to as the p-type doped nitride gallium layer 108 hereinafter). The p-type doped nitride gallium layer 108 is doped with at least one of magnesium (Mg), calcium (Ca), zinc (Zn), beryllium (Be), and carbon (C) and is further added with other dopants selected from a group consisting of strontium (Sr), barium (Ba), and radium (Ra), for example. It should be noted that as long as the additional dopants can change the band gap of the underlying layer (such as the aluminum gallium nitride layer 106 and the gallium nitride layer 104), the dopants can be used in the present disclosure and is not limited to those described above. In one embodiment, the p-type doped gallium nitride layer 108 may be formed by a metal organic chemical vapor deposition process (MOCVD) or other suitable deposition processes, a photolithography patterning process, and an etching process. In one embodiment, the p-type doped gallium nitride layer 108 may have a thickness ranging between about 1 nm and about 100 nm.

As shown in FIG. 1, the semiconductor device 100 includes a dielectric layer 116 formed on the p-type doped gallium nitride layer 108. The dielectric layer 116 may include one or more layers of dielectric materials. The dielectric materials may include such as silicon oxide ($SiO_2$), silicon nitride ($Si_3N_4$), silicon oxynitride (SiON), tantalum oxide ($Ta_2O_5$), titanium oxide ($TiO_2$), zinc oxide ($ZnO_2$), zirconium oxide ($ZrO_2$), aluminum oxide ($Al_2O_3$), hafnium oxide ($HfO_2$), aluminum nitride silicon ($AlSiN_3$), silicon oxide hafnium (HfSiO), hafnium silicon oxynitride (HfSiON), hafnium tantalum oxide (HMO), hafnium titanium oxide (HfTiO), hafnium zirconium oxide (HfZrO), silicon carbide (SiC), or a combination thereof. In one embodiment, the dielectric layer 116 may have a thickness ranging between about 1 nm and about 100 nm. The dielectric layer 116 may be formed by metal organic chemical vapor deposition (MOCVD), chemical vapor deposition (CVD), physical vapor deposition (PVD), atomic layer deposition (atomic Layer deposition, ALD, thermal oxidation, or other suitable deposition processes, lithographic patterning processes, and etching processes.

In one embodiment, the p-type doped gallium nitride layer 108 and the dielectric layer 116 may be formed by the same lithographic patterning and etching processes.

The band gap discontinuity and the piezo-electric effect between the nitride gallium layer 104 and the aluminum nitride gallium layer 106 create a carrier channel with highly mobile conducting electrons around the interface of the nitride gallium layer 104 and the aluminum nitride gallium layer 106. The carrier channel is referred to as a two-dimensional electron gas (2-DEG). By forming a p-type doped gallium nitride layer 108 on the aluminum nitride gallium layer 106, the 2-DEG is depleted from the bottom of the p-type doped gallium nitride layer 108. After applying a forward voltage to regenerate electrons, the 2-DEG as shown by the dotted line in FIG. 1 can be reformed to start the element. Similarly, the dashed lines drawn in FIG. 2 and FIG. 3 also represent the reformed 2-DEG after the application of the forward voltage.

Referring back to FIG. 1, the semiconductor device 100 further includes a passivation layer 118 formed on the aluminum nitride gallium layer 106 and over a portion of the p-type doped gallium nitride layer 108. In this embodiment, the passivation layer 118 is directly formed on the gallium nitride layer 106 and on the dielectric layer 116 disposed on the p-type doped gallium nitride layer 108. The passivation layer 118 may be used as a structural support and a physical isolation. The material of the passivation layer 118 may include silicon oxide ($SiO_2$), silicon nitride ($Si_3N_4$), silicon oxynitride (SiON), polyimide (PI), benzocyclobutene (BCB), polybenzoxazole (PBO), aluminum oxide ($Al_2O_3$), aluminum nitride (AlN), or other insulating materials. The material of the passivation layer 118 may be the same as or different than the material of the dielectric layer 116. For example, in some embodiments, the materials of both the passivation layer 118 and the dielectric layer 116 are silicon nitride ($Si_3N_4$). In other embodiments, the material of the passivation layer 118 is silicon oxide ($SiO_2$) and the material of the dielectric layer 116 is silicon nitride ($Si_3N_4$).

A portion of the passivation layer 118 may be removed by another photolithography patterning and etching process to form the opening of the passivation layer 118, thereby exposing a portion of the dielectric layer 116. The size, shape, and location of the opening are merely illustrative and are not intended to limit the present disclosure.

Next, as shown in FIG. 1, the semiconductor device 100 includes a gate 110 formed over the p-type doped gallium nitride layer 108. In this embodiment, the gate 110 is directly formed on the dielectric layer 116 disposed over the p-type doped gallium nitride layer 108. The gate 110 may include a conductive material, for example, metal such as nickel or gold. As shown in FIG. 1, the semiconductor device 100 may also include a source 112 and a drain 114 formed on opposite sides of the gate 110. The source 112 and the drain 114 may include one or more conductive materials. For example, the source 112 and the drain 114 include a metal selected from a group consisting of titanium, aluminum, nickel, and gold. The source 112 and the drain 114 may be formed by CVD, PVD, ALD, coating, sputtering, or other suitable processes. In one embodiment, the gate 110, the source 112 and the drain 114 are formed in the passivation layer 118.

It should be noted that, in the semiconductor device 100, by forming the dielectric layer 116 between the p-type doped gallium nitride layer 108 and the gate 110, the gate 110 metal can be isolated from the p-type doped gallium nitride layer 108, and thus an isolation effect of suppressing the gate leakage current is provided. In this embodiment, as shown in FIG. 1, the dielectric layer 116 covers the entire p-type doped gallium nitride layer 108 but is not formed between the gate 110 and the passivation layer 118 nor extending to the upper surface of the passivation layer 118. In addition, as shown in FIG. 1, after the photolithography patterning and etching process, the p-type doped gallium nitride layer 108 and the dielectric layer 116 do not extend between the source 112 and the drain 114 and are not in contact with the source 112 or the drain 114.

According to the process steps of the semiconductor device, the semiconductor device provided by the present disclosure may also have different patterns, as shown in FIG. 2 and FIG. 3. In FIG. 2 and FIG. 3, the semiconductor devices 200 and 300 are similar in structure to the semiconductor device 100, the differences are that the arrangements of the dielectric layers 216 and 316 are different from that of the dielectric layer 116. However, although the dielectric layers have different arrangements in the semiconductor devices 100 to 300, there is a dielectric layer disposed between the gate and the p-type doped gallium nitride layer in each of the semiconductor devices 100 to 300. Therefore, the gate metal can be isolated from the p-type doped gallium nitride, and the isolation effect of suppressing the gate leakage current can be provided. The differences among the structures and the processes of the semiconductor devices 200-300 and the semiconductor device 100 are described in detail below.

The semiconductor device 200 is similar in structure to the semiconductor device 100. However, the dielectric layer 216 is formed not only between the p-type doped gallium nitride layer 208 and the gate 210 but also between the passivation layer 218 and the gate 210 and extends to the upper surface of the passivation layer 218.

Compared to the process of the semiconductor device 100, the process of the semiconductor device 200 includes performing a photolithography patterning and etching process on the p-type doped III-V compound layer 208 (also referred to as the p-type nitride gallium layer 208 hereinafter) before forming the dielectric layer 216 to expose a part of the second III-V compound layer 206 (also referred to as aluminum nitride gallium layer 206 hereinafter), as shown in FIG. 2. After the photolithography patterning and etching process, the p-type doped gallium nitride layer 208 does not extend between the source 212 and the drain 214 and is not in contact with the source 212 or the drain 214.

Next, the passivation layer 218 is then formed on the aluminum nitride gallium layer 206 and over the p-type doped gallium nitride layer 208. A part of the passivation layer 218 may be removed by another photolithography patterning and etching process to form the opening of the passivation layer 218, thereby exposing a part of the p-type doped gallium nitride layer 208. The size, shape, and location of the opening are merely illustrative and are not intended to limit the present disclosure.

Then, the dielectric layer 216 may be conformally formed in the opening of the passivation layer 218 and on the passivation layer 218 by a suitable deposition process. As shown in FIG. 2, the dielectric layer 216 is formed on the p-type doped gallium nitride layer 208 and the passivation layer 218.

Finally, similarly to the process of the semiconductor device 100, the gate 210 is formed on the dielectric layer 216, and the source 212 and the drain 214 are formed on opposite sides of the gate 210.

It should be noted that, in the semiconductor device 200, by forming the dielectric layer 216 between the p-type doped gallium nitride layer 208 and the gate 210, the gate 210 metal can be isolated from the p-type doped gallium nitride layer 208, and thus an isolation effect of suppressing the gate leakage current can be provided. In this embodiment, as shown in FIG. 2, the dielectric layer 216 not only covers a part of the p-type doped gallium nitride layer 208 but is also formed between the passivation layer 218 and the gate 110 and extends to the upper surface of the passivation layer 218.

The semiconductor device 300 is similar in structure to the semiconductor device 100, the dielectric layer 316 is formed not only between the p-type doped gallium nitride layer 308 and the gate 310 but also between the gate 310 and the passivation layer 318. The semiconductor device 300 is similar in structure to the semiconductor device 200. However, compared to the semiconductor device 200, the dielectric layer 316 of the semiconductor device 300 does not extend to the upper surface of the passivation layer 318.

Compared to the process of the semiconductor device 100, the process of the semiconductor device 300 includes performing a photolithography patterning and etching process on the p-type doped III-V compound layer 308 (also referred to as the p-type nitride gallium layer 308 hereinafter) before forming the dielectric layer 316 to expose a part of the second III-V compound layer 306 (also referred to as aluminum nitride gallium layer 306 hereinafter), as shown in FIG. 3. After the photolithography patterning and etching process, the p-type doped gallium nitride layer 308 does not extend between the source 312 and the drain 314 and is not in contact with the source 312 or the drain 314.

Next, the passivation layer 318 is then formed on the gallium nitride layer 306 and over the p-type doped gallium nitride layer 308. A part of the passivation layer 318 may be removed by another photolithography patterning and etching process to form the opening of the passivation layer 318, thereby exposing a part of the p-type doped gallium nitride layer 308. The size, shape, and location of the opening are merely illustrative and are not intended to limit the present disclosure.

Then, the dielectric layer 316 may be conformally formed in the opening of the passivation layer 318 and on the passivation layer 318 by a suitable deposition process. As shown in FIG. 3, the dielectric layer 316 is formed on the p-type doped gallium nitride layer 308 and the passivation layer 318.

Unlike the process of forming semiconductor device 200, the process of forming semiconductor device 300 further includes performing a chemical-mechanical planarization (CMP) process until the upper surface of the passivation layer is exposed after forming the dielectric layer 316.

Finally, similar to the process of forming semiconductor device 100, the gate 310 is formed on the dielectric layer 316, and the source 312 and the drain 314 are formed on opposite sides of the gate 310.

It should be noted that, in the semiconductor device 300, by forming the dielectric layer 316 between the p-type doped gallium nitride layer 308 and the gate 310, the gate 310 metal can be isolated from the p-type doped gallium nitride layer 308, and thus an isolation effect of suppressing the gate leakage current can be provided. In this embodiment, as shown in FIG. 3, the dielectric layer 316 not only covers a part of the p-type doped gallium nitride layer 308 but is also formed between the passivation layer 318 and the gate 310.

The semiconductor devices 100, 200, and 300 in accordance with some embodiments of the present disclosure have the following advantages. The semiconductor device of the present disclosure includes a dielectric layer disposed between the gate and the p-type doped gallium nitride layer, preventing the gate metal and the p-type doped gallium nitride layer from contacting, therefore providing an isolation effect of suppressing the gate leakage current. For example, the dielectric layer of the semiconductor device 100 (as shown in FIG. 1) of the present disclosure covers the entire p-type doped gallium nitride layer. The dielectric layer of the semiconductor device 200 (as shown in FIG. 2) covers not only a part of the p-type doped gallium nitride layer but is also formed between the gate and the passivation layer and further extends to the upper surface of the passivation layer. The dielectric layer of the semiconductor device 300 (as shown in FIG. 3) of the present disclosure not only covers a part of the p-type doped gallium nitride layer but is also formed between the gate and the passivation layer. Because the aforementioned dielectric layers isolate the p-type doped gallium nitride layers from the upper gate metal, the Schottky contact formed by the direct contact of the gate metal and the p-type doped gallium nitride layer in the general E-node HEMT is not generated. Therefore, when applying a forward voltage to the semiconductor devices 100 to 300 of the present disclosure, the dielectric layer can provide an isolation effect of suppressing the gate leakage current and effectively improving the overall performance of the semiconductor devices 100 to 300.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor device, comprising: a substrate;
a first III-V compound layer disposed on the substrate;
a second III-V compound layer disposed on the first III-V compound layer;
a p-type doped III-V compound layer disposed on and covering only a portion of the second III-V compound layer;
a passivation layer disposed on the second III-V compound layer and over a part of the p-type doped III-V compound layer;
a gate disposed over the p-type doped III-V compound layer;
a source and a drain disposed on opposite sides of the gate; and
a dielectric layer disposed between the p-type doped III-V compound layer and the gate and further disposed between the passivation layer and the gate,
wherein an uppermost surface of the dielectric layer and an upper surface of the passivation layer are coplanar, the p-type doped III-V compound layer extends beyond the dielectric layer in a direction parallel to the upper surface of the passivation layer, an uppermost surface of the gate is higher than the upper surface of the passivation layer, and the gate does not overlap the passivation layer in a direction perpendicular to the upper surface of the passivation layer.

2. The semiconductor device as claimed in claim 1, wherein the dielectric layer does not extend to the upper surface of the passivation layer.

3. The semiconductor device as claimed in claim 1, wherein the dielectric layer is in direct contact with a portion of a sidewall of the gate.

4. The semiconductor device as claimed in claim 1, wherein the upper surface of the passivation layer is higher than a bottommost surface of the gate.

5. The semiconductor device as claimed in claim 1, wherein the p-type doped III-V compound layer and the passivation layer are in direct contact with an uppermost surface of the second III-V compound layer.

6. The semiconductor device as claimed in claim 1, wherein the substrate comprises a sapphire substrate, a silicon substrate, or a silicon carbide substrate.

7. The semiconductor device as claimed in claim 1, wherein the first III-V compound layer comprises a gallium nitride (GaN) layer.

8. The semiconductor device as claimed in claim 1, wherein the second III-V compound layer comprises an aluminum gallium nitride ($Al_xGa_{1-x}N$) layer, wherein $0<x<1$.

9. The semiconductor device as claimed in claim 1, wherein the p-type doped III-V compound layer comprises a p-type doped gallium nitride (GaN) layer.

10. The semiconductor device as claimed in claim 9, wherein the p-type doped gallium nitride (GaN) layer is doped with at least one of magnesium (Mg), calcium (Ca), zinc (Zn), beryllium (Be), and carbon (C) and is further doped with an element selected from a group consisting of strontium (Sr), barium (Ba), and radium (Ra).

11. The semiconductor device as claimed in claim 1, wherein the material of the dielectric layer comprises silicon oxide ($SiO_2$), silicon nitride ($Si_3N_4$), silicon oxynitride (SiON), tantalum oxide ($Ta_2O_5$), titanium oxide ($TiO_2$), zinc oxide ($ZnO_2$), zirconium oxide ($ZrO_2$), aluminum oxide ($Al_2O_3$), hafnium oxide ($HfO_2$), aluminum nitride silicon ($AlSiN_3$), silicon oxide hafnium (HfSiO), hafnium silicon oxynitride (HfSiON), hafnium tantalum oxide (HfTaO), hafnium titanium oxide (HMO), hafnium zirconium oxide (HfZrO), silicon carbide (SiC), or a combination thereof.

\* \* \* \* \*